(12) United States Patent
Keene et al.

(10) Patent No.: US 8,365,117 B2
(45) Date of Patent: Jan. 29, 2013

(54) SOLUTIONS FOR ON-CHIP MODELING OF OPEN TERMINATION OF FRINGE CAPACITANCE

(75) Inventors: Michael P. Keene, Barre, VT (US); Guoan Wang, South Burlington, VT (US); Wayne H. Woods, Jr., Burlington, VT (US); Jiansheng Xu, Essex Junction, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 13/158,562

(22) Filed: Jun. 13, 2011

(65) Prior Publication Data

US 2012/0317530 A1 Dec. 13, 2012

(51) Int. Cl.
  *G06F 17/50* (2006.01)
(52) U.S. Cl. .......................................................... 716/110
(58) Field of Classification Search .................. 716/100, 716/110
  See application file for complete search history.

(56) References Cited

U.S. PATENT DOCUMENTS

| | | | |
|---|---|---|---|
| 6,438,729 B1 * | 8/2002 | Ho | 716/113 |
| 6,477,686 B1 | 11/2002 | Dewey, III et al. | |
| 7,231,618 B2 * | 6/2007 | Huang et al. | 716/115 |
| 8,239,804 B2 * | 8/2012 | Elfadel et al. | 716/124 |
| 2005/0193354 A1 * | 9/2005 | Ohba et al. | 716/5 |
| 2005/0240883 A1 * | 10/2005 | Huang et al. | 716/1 |
| 2009/0248335 A1 * | 10/2009 | Elfadel et al. | 702/65 |
| 2009/0327983 A1 * | 12/2009 | Li et al. | 716/5 |
| 2011/0078642 A1 * | 3/2011 | Elfadel et al. | 716/106 |

OTHER PUBLICATIONS

U.S. Appl. No. 12/806,707, filed Oct. 18, 2010.
Bansal et al., "An Analytical Fringe Capacitance Model for Interconnects Using Conformal Mapping", IEEE Transactions on Computer-Aided Design of Integrated Circuits and Systems, vol. 25, No. 12, Dec. 2006.
Bansal et al., "Modeling and Optimization of Fringe Capacitance of Nanoscale DGMOS Devices", IEEE Transactions on Electron Devices, vol. 52, No. 2, Feb. 2005.
Shim et al., Characterization of On-chip Interconnections and Capacitive Coupling Effect on CMOS Operational Amplifier, Korea Advanced Institute of Science and Technology.

* cited by examiner

*Primary Examiner* — Suchin Parihar
(74) *Attorney, Agent, or Firm* — Anthony K. Canale; Hoffman Warnick LLC

(57) ABSTRACT

A computer-implemented method of generating a library object for an integrated circuit design is disclosed. In one embodiment, the method includes: analyzing a pair of integrated circuit design objects for fringe capacitance effects between the pair of integrated circuit design objects; and generating the library object accounting for the fringe capacitance effects prior to completion of a layout design for the integrated circuit design.

20 Claims, 15 Drawing Sheets

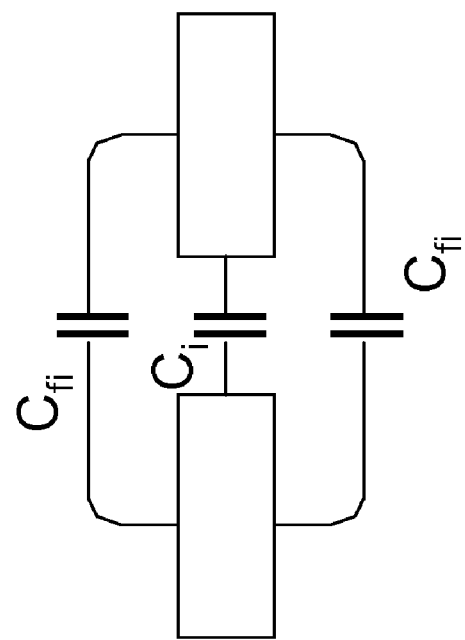
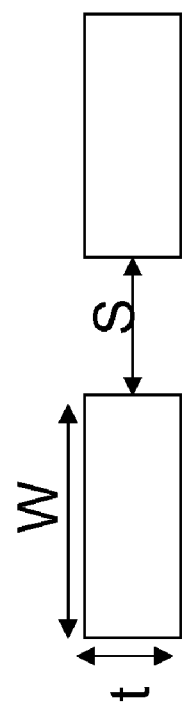
(b)
FIG. 12

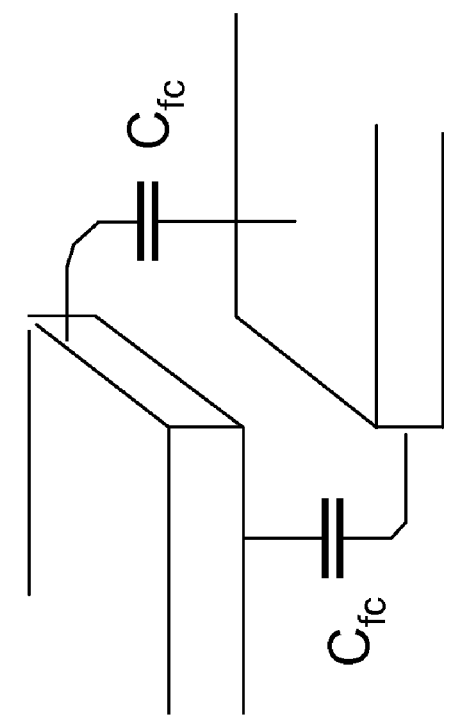
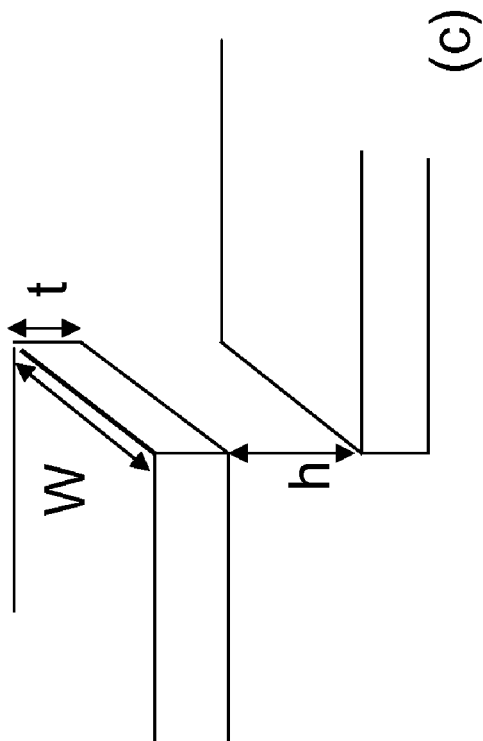
(c)
FIG. 13

SOLUTIONS FOR ON-CHIP MODELING OF OPEN TERMINATION OF FRINGE CAPACITANCE

BACKGROUND

The subject matter disclosed herein relates to solutions for modeling objects in the design of integrated circuits. More specifically, the subject matter disclosed herein relates to developing a library device and generating an on-chip model for open termination fringe capacitance in an integrated circuit and an associated design structure.

As integrated circuit technologies shrink in size along with the advancement in technology, interconnect wiring effects can impact the performance of those integrated circuits significantly. Generating accurate and workable models of the wires (e.g., interconnect lines, vias, etc.) can aid in effectively designing the integrated circuit to avoid negative effects such as unwanted fringe capacitances between wires, or account for these effects in advance.

Conventional approaches for evaluating and modeling these negative effects (e.g., fringe capacitances) use parasitic extraction tools after the integrated circuit layout has been designed. However, these late-stage (post-layout) approaches fail to generate models that effectively compensate for the effects of fringe capacitances at pre-layout stage.

BRIEF SUMMARY

A computer-implemented method of generating a library object for an integrated circuit design is disclosed. In one embodiment, the method includes: analyzing a pair of integrated circuit design objects for fringe capacitance effects between the pair of integrated circuit design objects; and generating the library object accounting for the fringe capacitance effects prior to completion of a layout design for the integrated circuit design.

A first aspect includes a computer-implemented method of generating a library object for an integrated circuit design, the method including: analyzing a pair of integrated circuit design objects for fringe capacitance effects between the pair of integrated circuit design objects; and generating the library object accounting for the fringe capacitance effects prior to completion of a layout design for the integrated circuit design.

A second aspect includes a system having: at least one computing device configured to generate a library object for an integrated circuit design by performing actions including: analyzing a pair of integrated circuit design objects for fringe capacitance effects between the pair of integrated circuit design objects; and generating the library object accounting for the fringe capacitance effects prior to completion of a layout design for the integrated circuit design.

A third aspect includes computer program comprising program code embodied in at least one computer-readable storage medium, which when executed, enables a computer system to generate a library object for an integrated circuit design by performing actions including: analyzing a pair of integrated circuit design objects for fringe capacitance effects between the pair of integrated circuit design objects; and generating the library object accounting for the fringe capacitance effects prior to completion of a layout design for the integrated circuit design.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which:

FIGS. 11-13 show three illustrative fringe capacitance scenarios, respectively, contemplated according to embodiments of the invention.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

As noted herein, the subject matter disclosed herein relates to solutions for modeling objects in the design of integrated circuits. More specifically, the subject matter disclosed herein relates to developing a library device and generating an on-chip model for open termination fringe capacitance in an integrated circuit and an associated design structure.

As integrated circuit technologies shrink in size along with the advancement in technology, interconnect wiring effects can impact the performance of those integrated circuits significantly. Generating accurate and workable models of the wires (e.g., interconnect lines, vias, etc.) can aid in effectively designing the integrated circuit to avoid negative effects such as unwanted fringe capacitances between wires, or account for these effects in advance.

Conventional approaches for evaluating and modeling these negative effects (e.g., fringe capacitances) use parasitic extraction tools after the integrated circuit layout has been designed. However, these parasitic extraction approaches can only be performed after the layout has been designed.

In contrast to these conventional approaches, aspects include formulating and generating models for fringe capacitance scenarios prior to the layout phase of integrated circuit design.

In one aspect, a computer-implemented method is disclosed including the following processes:

(A) analyzing a pair of integrated circuit design objects for fringe capacitance effects between the pair of integrated circuit design objects; and (B) generating the library object accounting for the fringe capacitance effects prior to completion of a layout design for the integrated circuit design.

Figure 1:
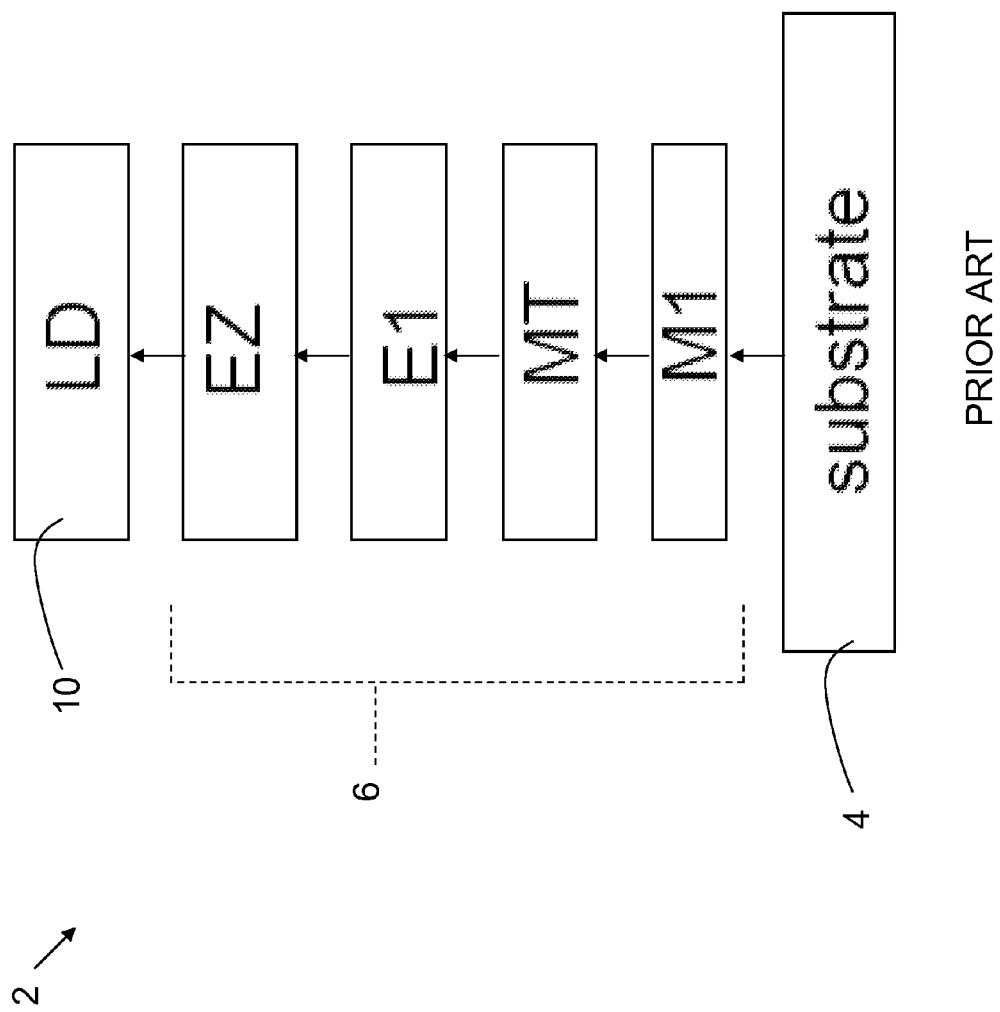
FIG. 1 shows a schematic depiction of a plurality of metal layer options in a conventional back-end-of-the-line process.

Turning to FIG. 1, a schematic depiction of a plurality of metal layer options 2 in a conventional back end of the line process is shown. As shown, a substrate 4 option may be chosen, followed by choice of one or more metal layer options 6 (M1, MT, E1 and/or EZ metal layers), followed by layout design (or, LD) options 10. As will be described further herein, conventional approaches to accounting for fringe capacitance effects do not take those effects into account prior to choosing one of the layout design (LD) options 10.

Figure 2:
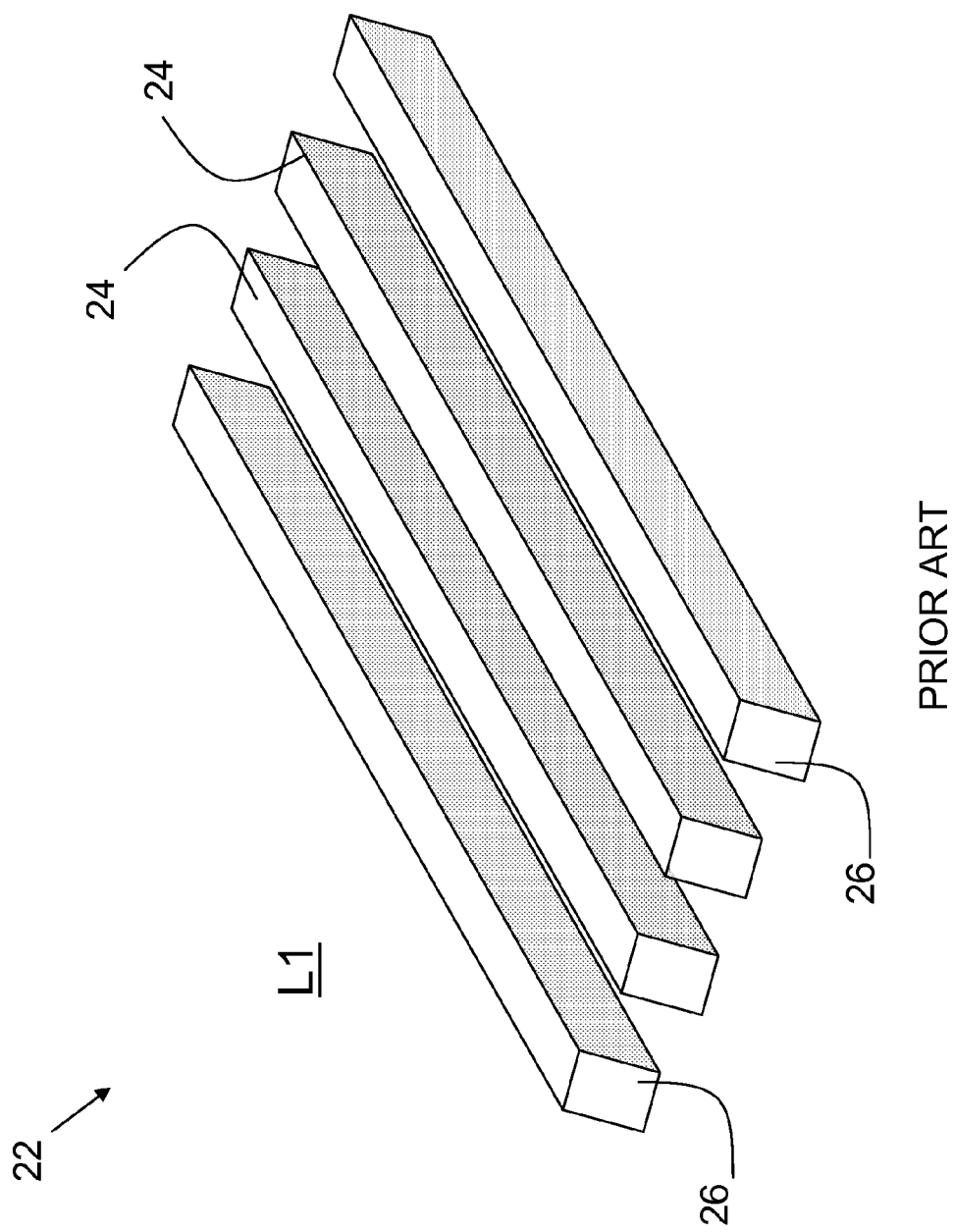
FIG. 2 illustrates a three-dimensional structure of a plurality of transmission lines according to the prior art.

FIG. 2 illustrates a three-dimensional structure including a plurality of known transmission lines 22 on a shared level (or, plane) L1. The transmission lines 22 can include signal lines 24 and ground lines 26, which may contribute, respectively to fringe capacitance effects between adjacent or proximate lines (e.g., transmission lines 22). Further, the transmission lines 22 may also contribute to fringe capacitance effects among one or more lines on a different level (or, plane).

Figure 3:
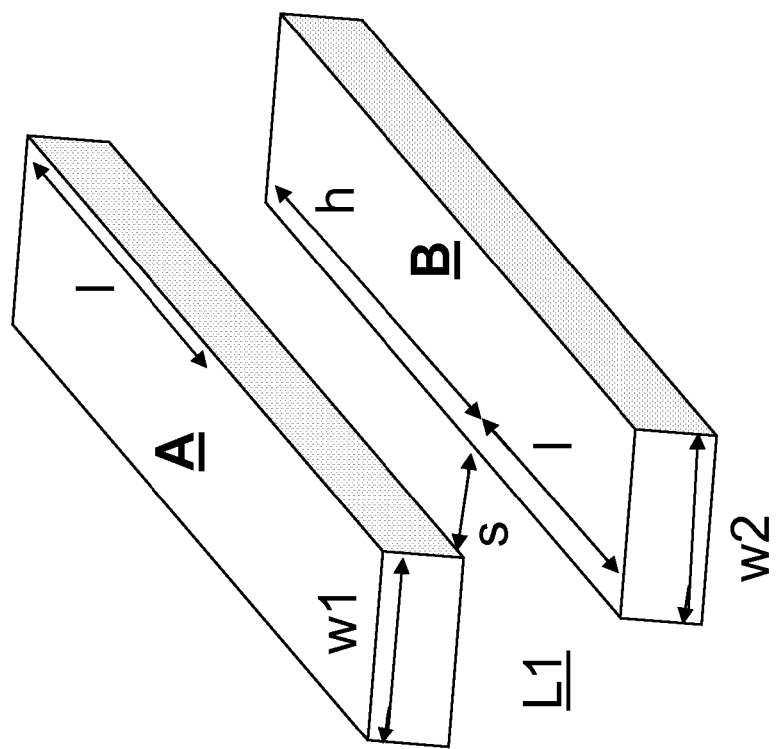
FIG. 3 illustrates a three-dimensional structure of a plurality of transmission lines according to the prior art.
Figure 4:
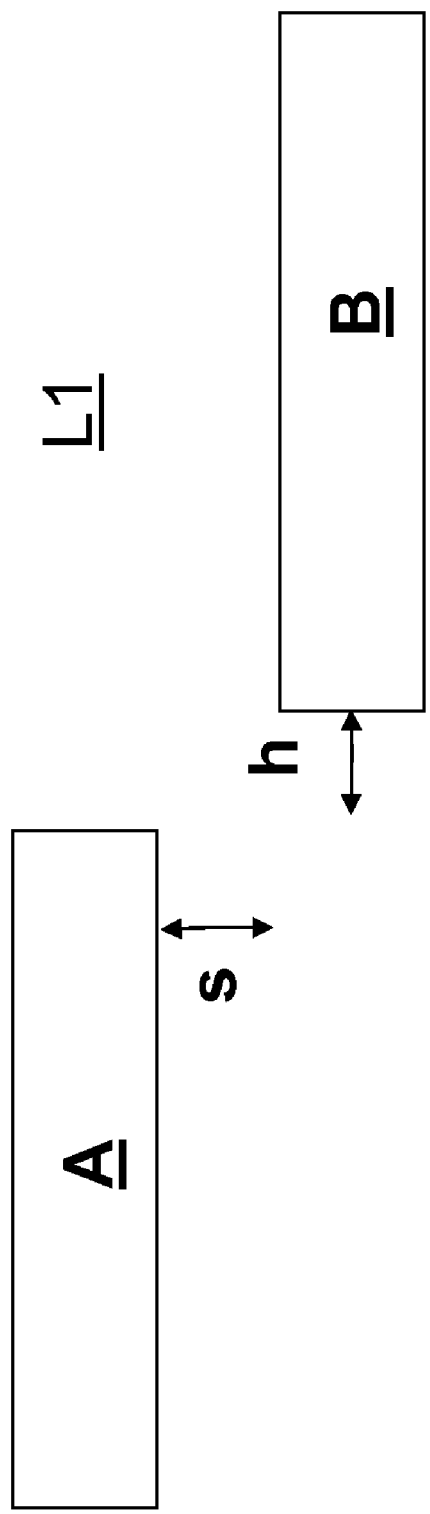
FIG. 4 illustrates a three-dimensional structure of a plurality of transmission lines according to the prior art.
Figure 5:
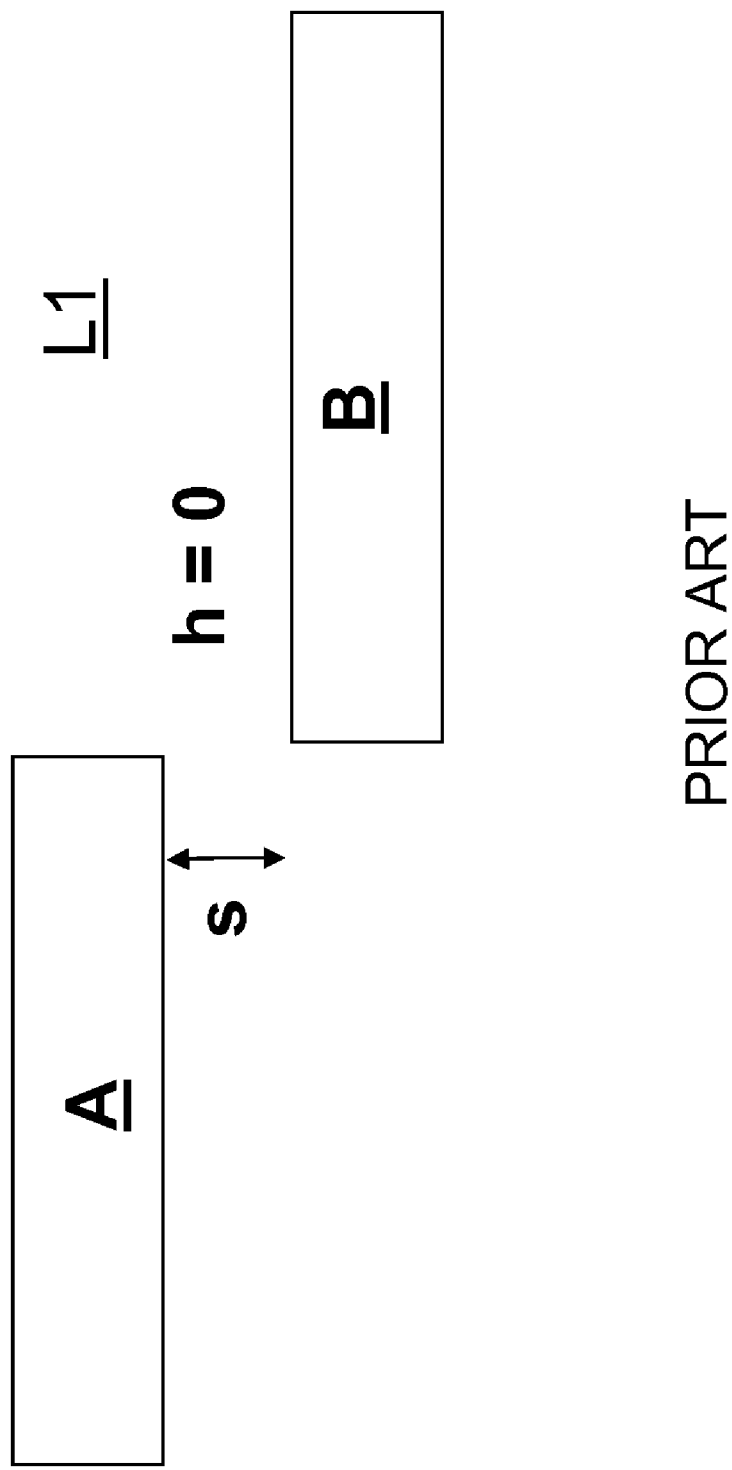
FIG. 5 illustrates a three-dimensional structure of a plurality of transmission lines according to the prior art.

FIG. 3 illustrates a three-dimensional structure including two lines (A and B) located on a shared level (or, plane) L1 having at least one overlapping section (h) across the line lengths. The spacing between line A and line B is indicated as a distance "S", and the non-overlapping lengths are indicated as lengths "1." The line widths are indicated as "w1" (line A) and "w2" (line B). In this case, distance "h" is a negative value (indicating overlap along the lengths). FIG. 4 illustrates a three-dimensional model of lines A and B of FIG. 3, where line A and line B are on a shared or common level L1. Where the lines have both a spacing S separating line A and line B along their width directions, but also, a distance "h" separating the lines along their lengths. In this case "h" is greater than zero. FIG. 5 illustrates a three-dimensional model of lines A and B of FIGS. 3-4, where line A and line B are on a shared or common level. In this case, the lines have a separation along their lengths of zero, where value "h" is equal to zero, and the end of line A is aligned with the end of line B along their respective lengths.

Figure 6:
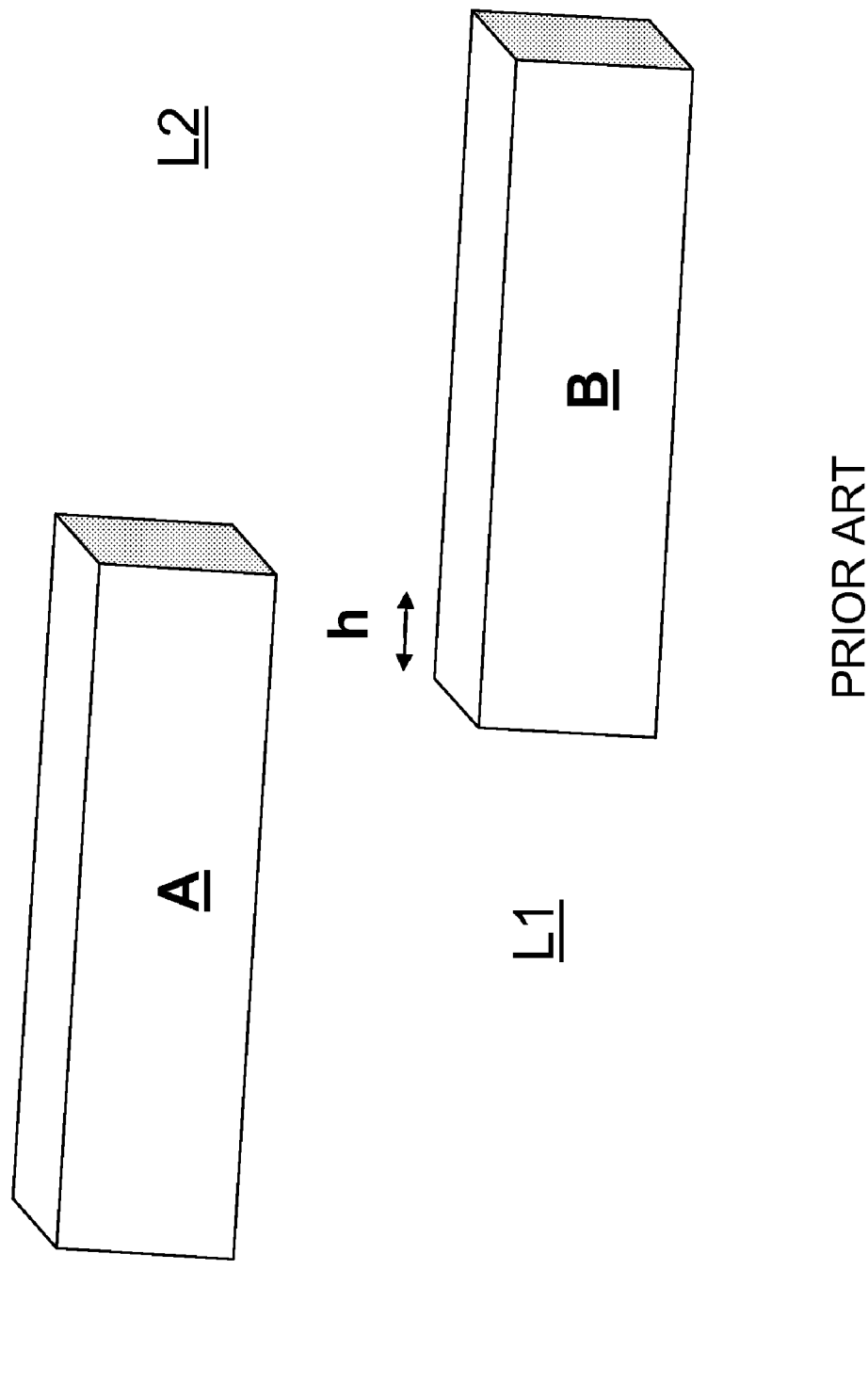
FIG. 6 illustrates a three-dimensional structure of a plurality of transmission lines according to the prior art.
Figure 7:
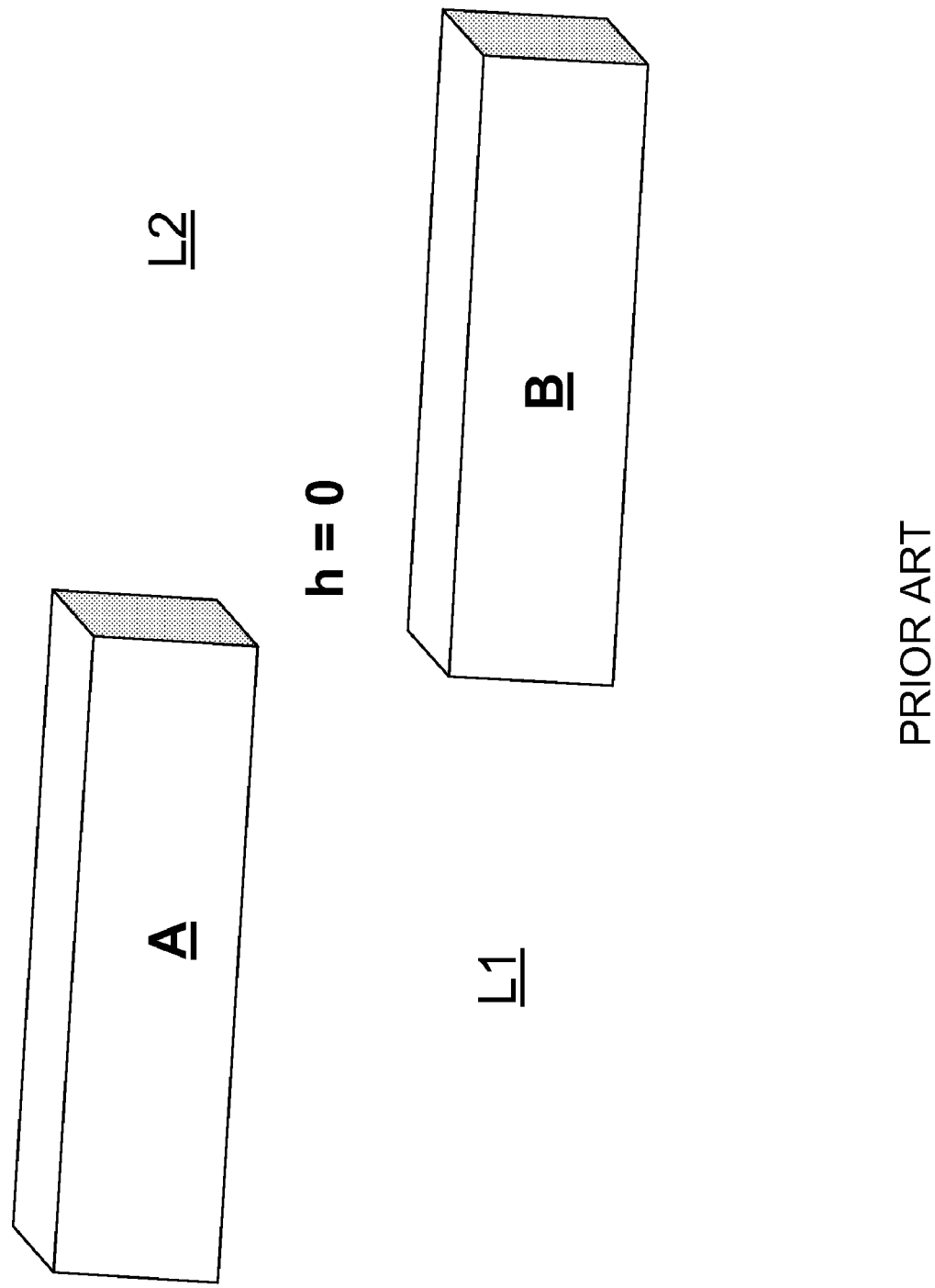
FIG. 7 illustrates a three-dimensional structure of a plurality of transmission lines according to the prior art.
Figure 8:
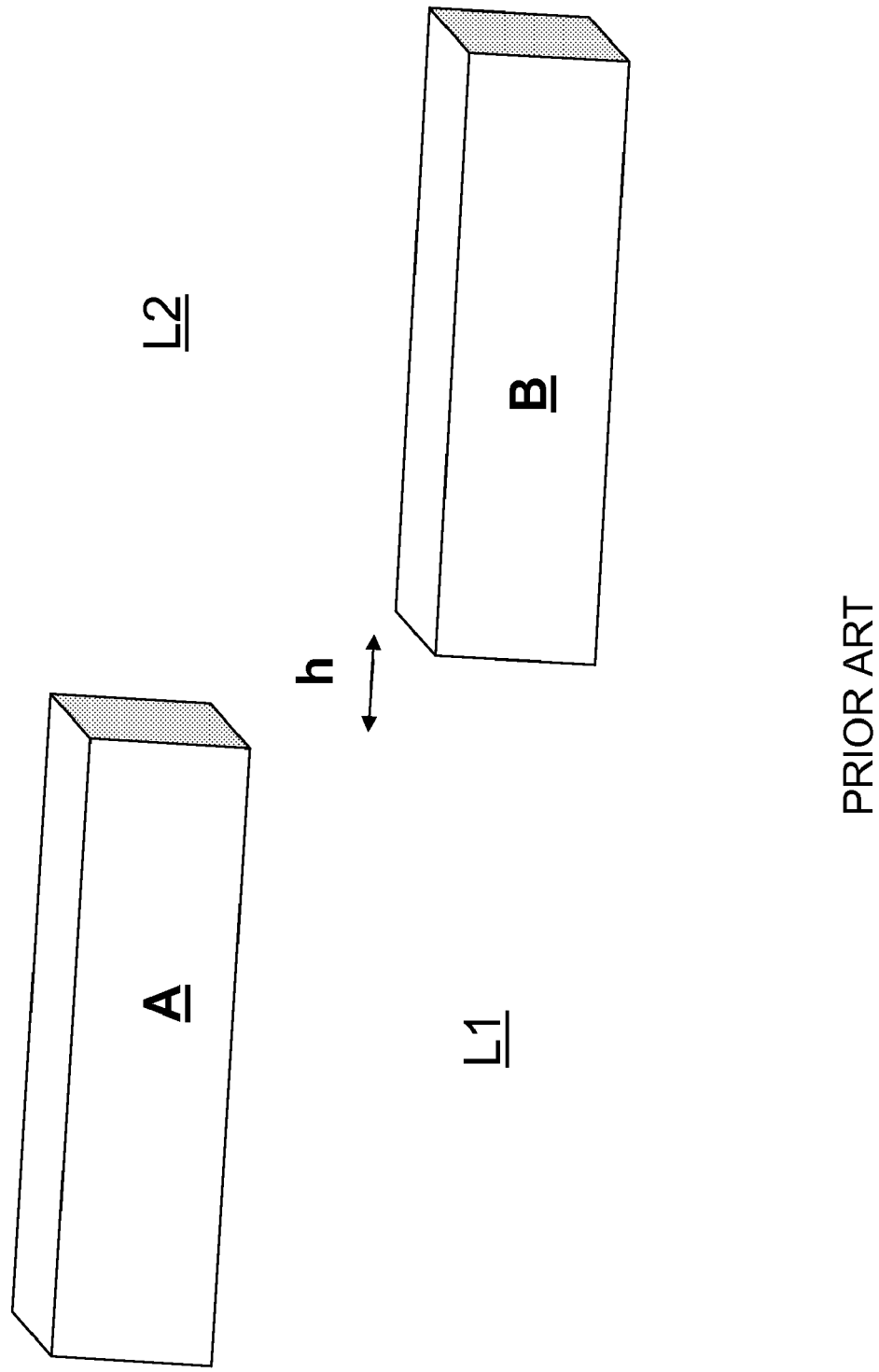
FIG. 8 illustrates a three-dimensional structure of a plurality of transmission lines according to the prior art.

FIGS. 6-8 illustrate three scenarios similar to those illustrated in FIGS. 3-5, where a pair lines (A and B) have a negative "h" value (indicating an overlap along a length, a zero "h" value (indicating no overlap), and a positive "h" value (indicating space between line ends). However, FIGS. 6-8 illustrate these scenarios where line A and line B are on different levels (or planes) L1 and L2 in a layout.

Figure 9:
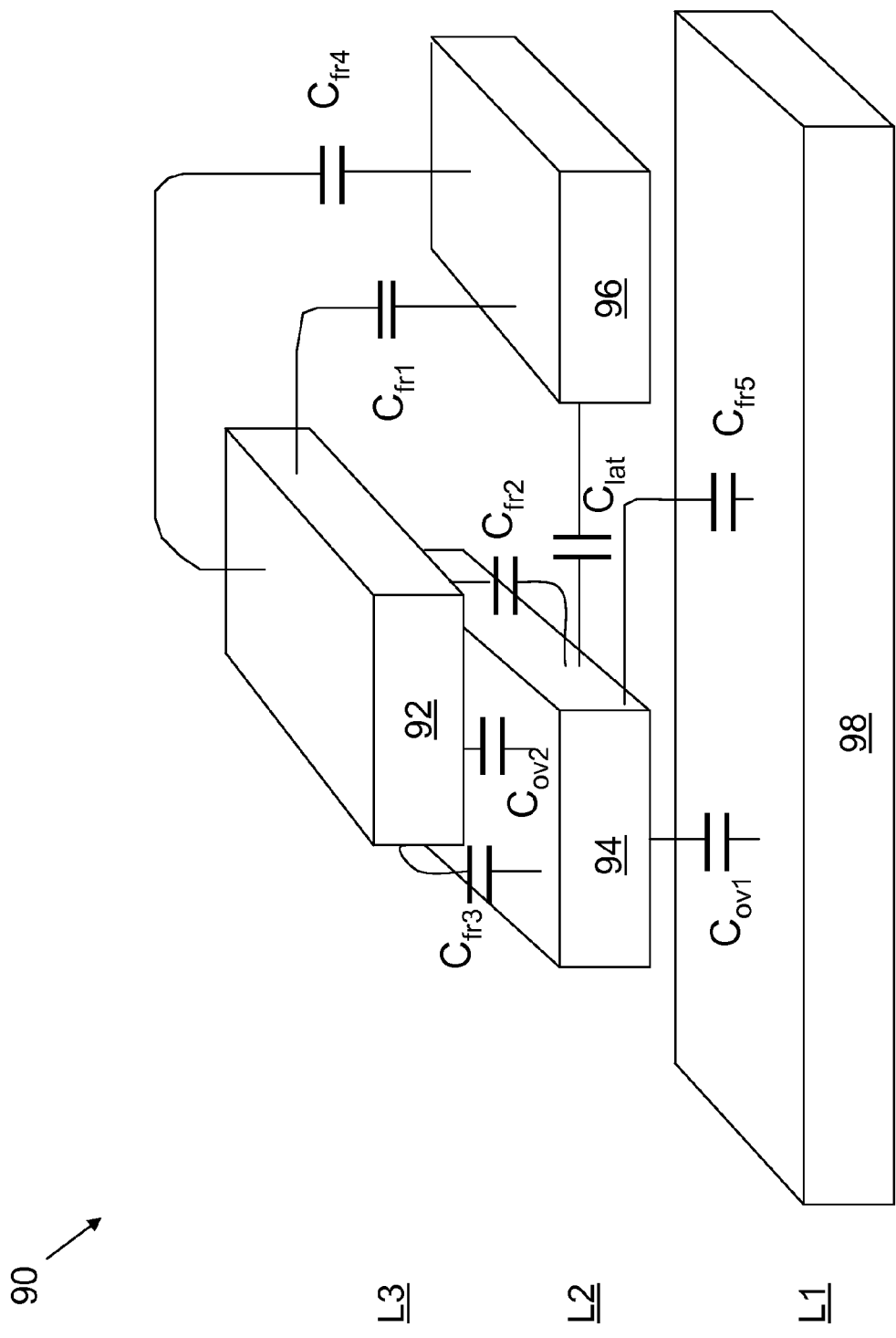
FIG. 9 shows a three-dimensional schematic illustration of a portion of an example integrated circuit design according to embodiments of the invention.

FIG. 9 shows a three-dimensional schematic illustration of a portion of an example integrated circuit design 90 according to embodiments. As shown, this example may include a plurality of integrated circuit design objects 92, 94, 96, 98 (e.g., lines) and associated capacitance modelings between those objects, according to embodiments. According to aspects, a computer-implemented method of generating a library object for an integrated circuit design is disclosed, where the method includes: (a) analyzing a pair of integrated circuit design objects (e.g., two of objects 92, 94, 96, 98) for fringe capacitance effects between the pair of integrated circuit design objects; and (b) generating the library object accounting for the fringe capacitance effects prior to completion of a layout design for the integrated circuit design. In some cases, as illustrated in FIG. 9, the pair of integrated circuit design objects (e.g., two of objects 92, 94, 96, 98) may be adjacent lines (e.g., lines 92 and 94, or 94 and 98, or 94 and 96). In some cases, the pair of integrated circuit design objects (e.g., two of objects 92, 94, 96, 98) may be lines within a same level of the integrated circuit design (e.g., lines 94 and 96). In other cases, the pair of integrated circuit design objects (e.g., two of objects 92, 94, 96, 98) may be lines within different levels of the integrated circuit design (e.g., lines 94 and 98, or 94 and 92, or 96 and 98, or 92 and 94, or 92 and 96). In other cases, the pair of integrated circuit design objects (e.g., two of objects 92, 94, 96, 98) can represent neighboring signal lines (e.g., lines 94 and 96).

In some aspects, the fringe capacitance effects can be analyzed between similarly facing edges of adjacent lines, or between faces aligned at right angles with respect to the corresponding face on the adjacent line. For example, a fringe capacitance between similarly facing edges of lines 92 and 96 (on distinct levels, L3 and L2, respectively) may be denoted as $C_{fr}4$. A fringe capacitance between an edge of a first object (e.g., an edge of line 92) and a perpendicularly aligned edge of a second object (e.g., an edge of line 96) can be denoted as $C_{fr}1$. As is illustrated in the example configuration of FIG. 9, a plurality of fringe capacitances ($C_{fr}1, C_{fr}2, C_{fr}3, C_{fr}4, C_{fr}5$) can be modeled between objects (e.g., lines 92, 94, 96, 98) on one or more levels (L1, L2, L3) of the integrated circuit design 90.

Figure 10:
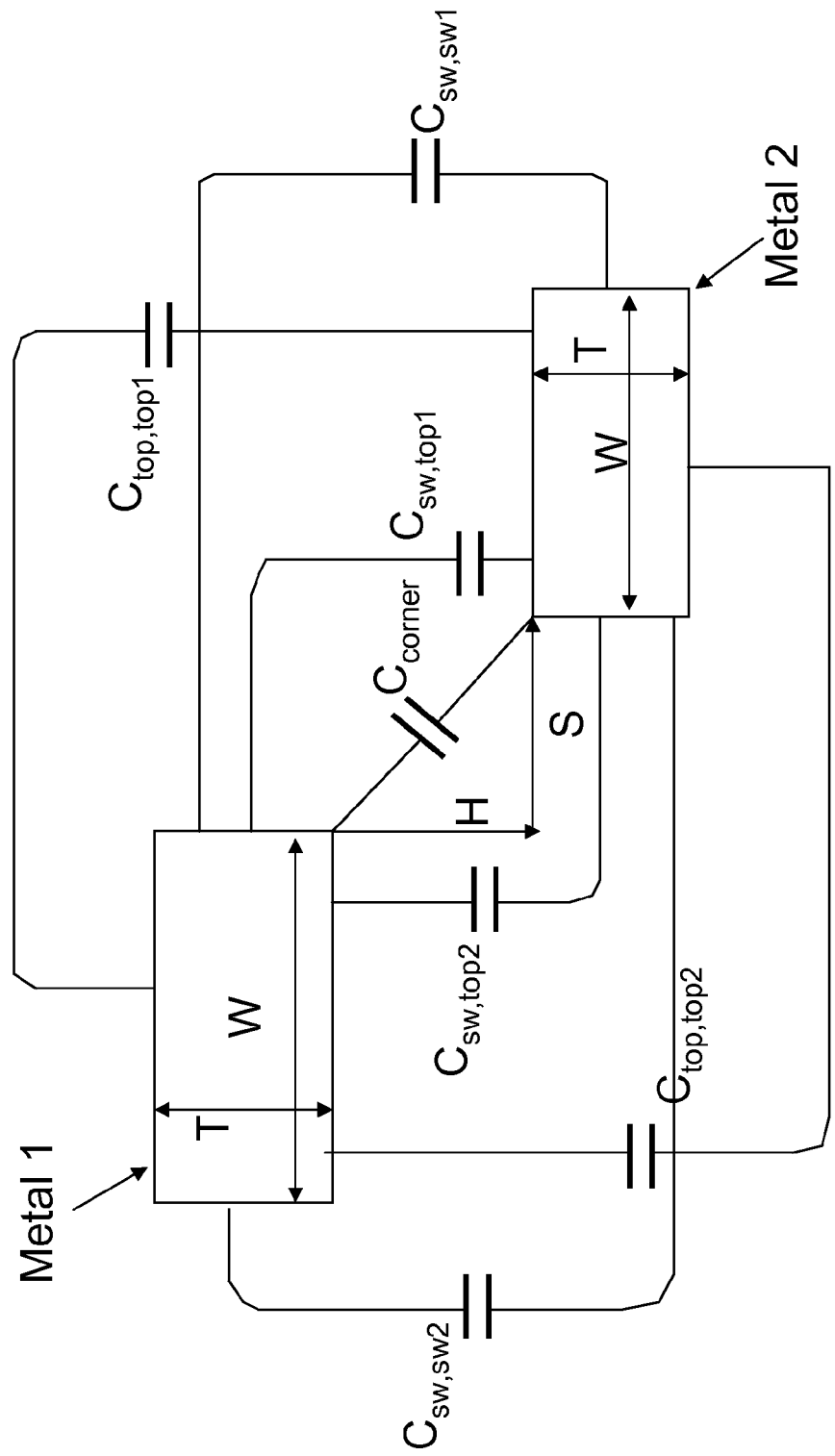
FIG. 10 shows an illustrative example of fringe capacitance analyses conducted for a plurality of metal objects according to embodiments of the invention.

FIG. 10 shows an illustrative example of fringe capacitance analyses conducted for a plurality of faces on a first metal object (Metal 1) and a second metal object (Metal 2), where the metal objects may be metal lines, vias, interconnects, etc. in any case, as is shown in FIG. 10, a plurality of fringe capacitances may be modeled for proximate lines (each having a thickness "t" and a width "w").

Figure 11:
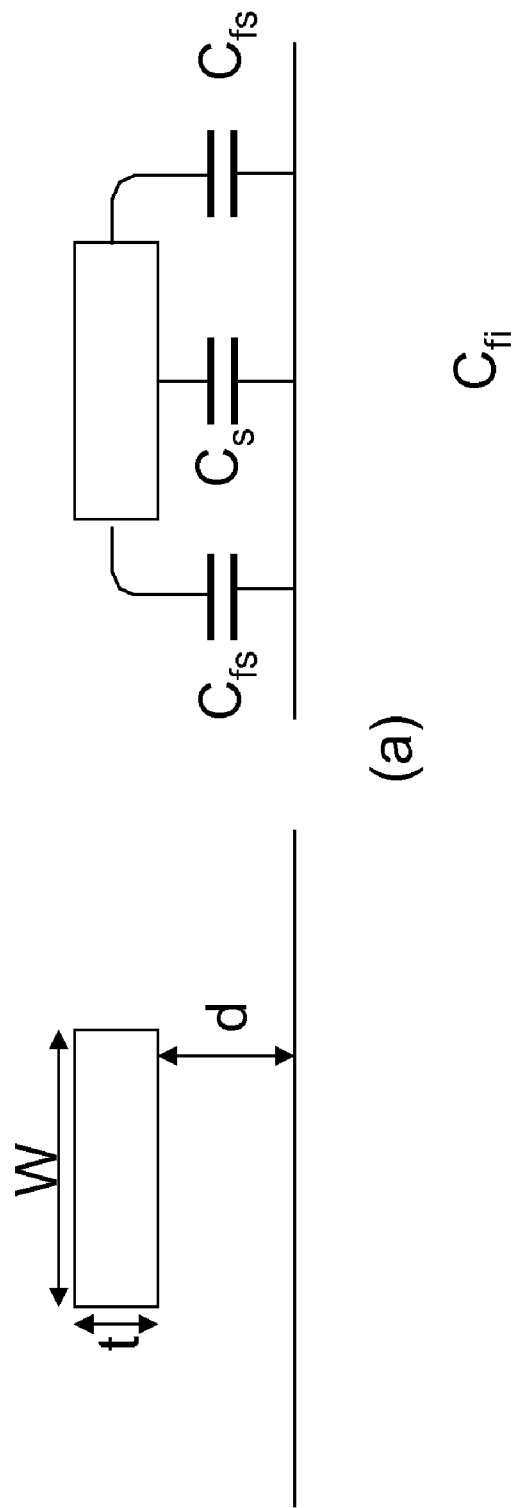

FIGS. 11-13, respectively, show three illustrative fringe capacitance scenarios contemplated according to embodiments: (a) Fringe capacitance between a signal metal line and a wide metal line, or ground plane; (b) Fringe capacitance between a signal line and a signal line; and (c) Fringe capacitance between edges of lines on different levels in a design. As shown in scenario (a), illustrated in FIG. 11, the fringe capacitance (Cfs) may be calculated as follows, where Cs is the face-to-face capacitance of the adjacent signal metal line and wide metal line:

$$C_{fs} = 1.8\varepsilon \frac{L}{\pi} \ln\left(\frac{2d + 0.5t_{eff} + \sqrt{t_{eff}^2 + dt_{eff}}}{0.06d}\right)$$

As shown in scenario (b), illustrated in FIG. 12, fringe capacitance (Cfi) may be calculated as follows, where Ci is the face-to-face capacitance of the adjacent signal lines:

$$C_{fi} = 2\varepsilon \frac{L}{\pi} \ln\left(\frac{1.25s + W_{eff} + 1.75e - 7}{s}\right)$$

As shown in scenario (c), illustrated in FIG. 13, fringe capacitance (Cfc) may be calculated as follows:

$$C_{fc} = 8\varepsilon \frac{W_{eff}}{\pi} \ln\left[\left(\frac{2h + t_{eff} + \sqrt{t_{eff}^2 + 2ht_{eff}}}{0.1h}\right)\right]$$

Figure 14:
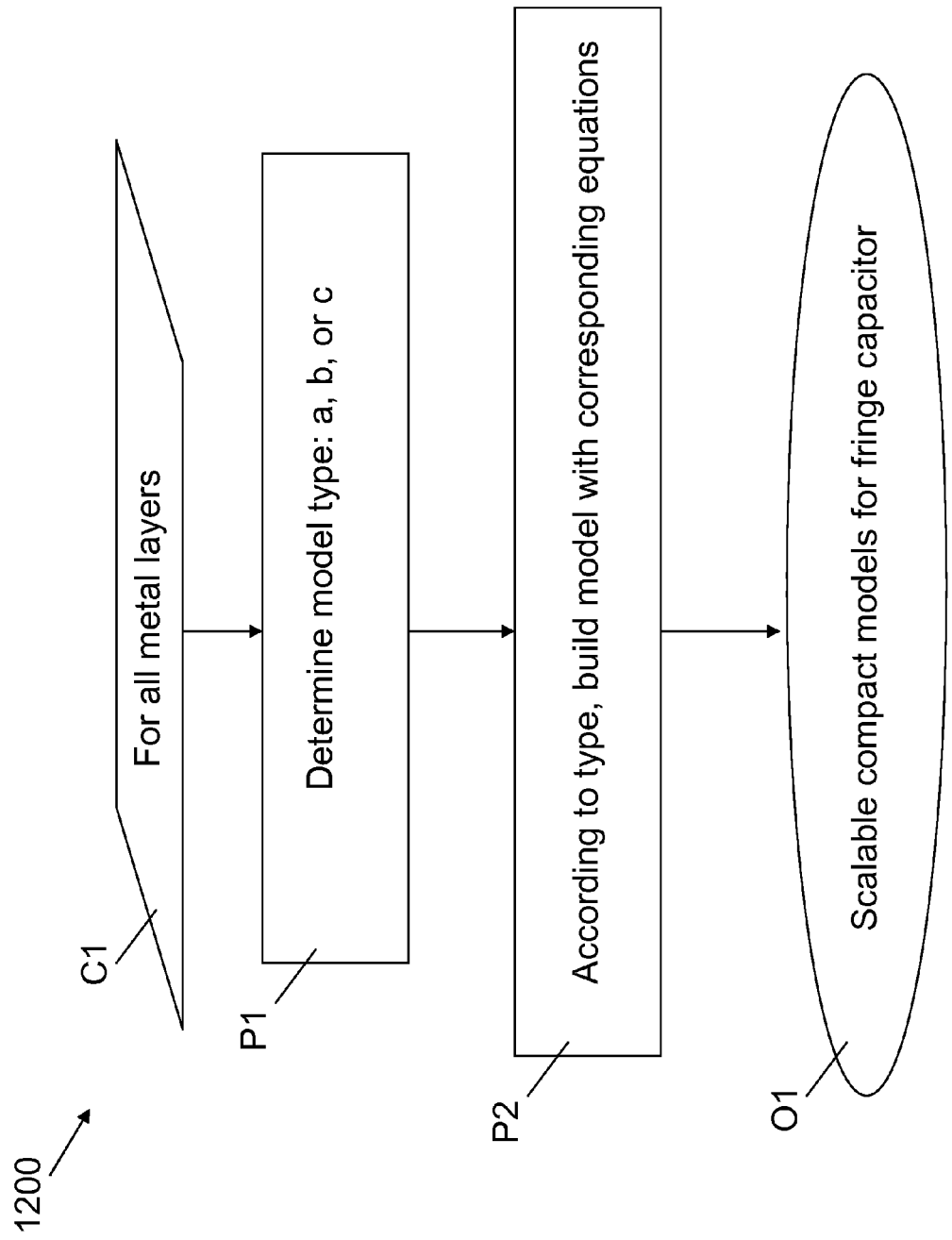
FIG. 14 shows an illustrative method flow diagram illustrating model generation according to embodiments of the invention.

In any case, aspects of the invention may allow for analysis of the fringe capacitances of the objects within an integrated circuit structure. For example, turning to FIG. 14, an illustrative method flow diagram 1200 is shown illustrating a process according to aspects. In process P1, a type of fringe capacitance scenario may be determined (according to types a, b, or c described with reference to FIGS. 11-13), where each type of fringe capacitance scenario involves an associated equation (a), (b) or (c) illustrated and described herein.

Process P2 may include building models of the fringe capacitance effects according to the particular fringe capacitance scenario and the analysis performed (e.g., via fringe capacitance calculated by one of the equations herein). Following building of the models, an object O1 may be provided in the form of a scalable, compact model for fringe capacitance. This object may be used in a later-performed layout design process.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

Figure 15:
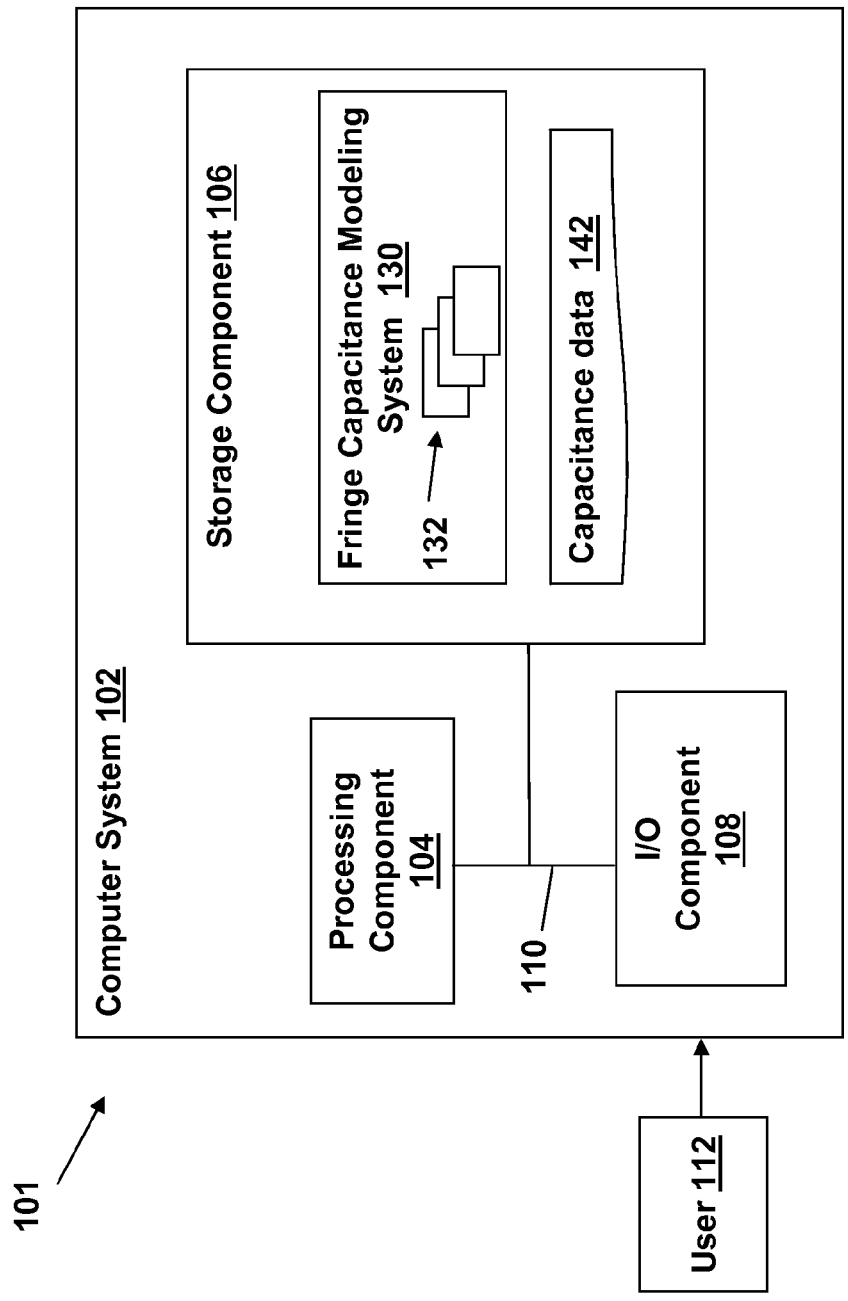
FIG. 15 shows an illustrative environment for modeling fringe capacitances according to embodiments of the invention.

FIG. 15 depicts an illustrative environment 101 for modeling fringe capacitances according to embodiments. To this extent, the environment 101 includes a computer system 102 that can perform a process described herein in order to integrate manufacturing feedback into an integrated circuit structure design. In particular, the computer system 102 is shown as including a fringe capacitance modeling system 130, which makes computer system 102 operable to model the fringe capacitance of components in an integrated circuit prior to the layout design phase by performing any/all of the processes described herein and implementing any/all of the embodiments described herein.

The computer system 102 is shown including a processing component 104 (e.g., one or more processors), a storage component 106 (e.g., a storage hierarchy), an input/output (I/O) component 108 (e.g., one or more I/O interfaces and/or devices), and a communications pathway 110. In general, the processing component 104 executes program code, such as the fringe capacitance modeling system 130, which is at least partially fixed in the storage component 106. While executing program code, the processing component 104 can process data, which can result in reading and/or writing transformed data from/to the storage component 106 and/or the I/O component 108 for further processing. The pathway 110 provides a communications link between each of the components in the computer system 102. The I/O component 108 can comprise one or more human I/O devices, which enable a human user 112 to interact with the computer system 102 and/or one or more communications devices to enable a system user 112 to communicate with the computer system 102 using any type of communications link. To this extent, the fringe capacitance modeling system 130 can manage a set of interfaces (e.g., graphical user interface(s), application program interface, etc.) that enable human and/or system users 112 to interact with the fringe capacitance modeling system 130. Further, the fringe capacitance modeling system 130 can manage (e.g., store, retrieve, create, manipulate, organize, present, etc.) data, such as capacitance data 142 using any solution.

In any event, the computer system 102 can comprise one or more general purpose computing articles of manufacture (e.g., computing devices) capable of executing program code, such as the fringe capacitance modeling system 130, installed thereon. As used herein, it is understood that "program code" means any collection of instructions, in any language, code or notation, that cause a computing device having an information processing capability to perform a particular function either directly or after any combination of the following: (a) conversion to another language, code or notation; (b) reproduction in a different material form; and/or (c) decompression. To this extent, the fringe capacitance modeling system 130 can be embodied as any combination of system software and/or application software.

Further, the fringe capacitance modeling system 130 can be implemented using a set of modules 132. In this case, a module 132 can enable the computer system 102 to perform a set of tasks used by the fringe capacitance modeling system 130, and can be separately developed and/or implemented apart from other portions of the fringe capacitance modeling system 130. As used herein, the term "component" means any configuration of hardware, with or without software, which implements the functionality described in conjunction therewith using any solution, while the term "module" means program code that enables the computer system 102 to implement the functionality described in conjunction therewith using any solution. When fixed in a storage component 106 of a computer system 102 that includes a processing component 104, a module is a substantial portion of a component that implements the functionality. Regardless, it is understood that two or more components, modules, and/or systems may share some/all of their respective hardware and/or software. Further, it is understood that some of the functionality discussed herein may not be implemented or additional functionality may be included as part of the computer system 102.

When the computer system 102 comprises multiple computing devices, each computing device may have only a portion of fringe capacitance modeling system 130 fixed thereon (e.g., one or more modules 132). However, it is understood that the computer system 102 and fringe capacitance modeling system 130 are only representative of various possible equivalent computer systems that may perform a process described herein. To this extent, in other embodiments, the functionality provided by the computer system 102 and fringe capacitance modeling system 130 can be at least partially implemented by one or more computing devices that include any combination of general and/or specific purpose hardware with or without program code. In each embodiment, the hardware and program code, if included, can be created using standard engineering and programming techniques, respectively.

Regardless, when the computer system 102 includes multiple computing devices, the computing devices can communicate over any type of communications link. Further, while performing a process described herein, the computer system 102 can communicate with one or more other computer systems using any type of communications link. In either case, the communications link can comprise any combination of various types of wired and/or wireless links; comprise any combination of one or more types of networks; and/or utilize any combination of various types of transmission techniques and protocols.

The computer system 102 can obtain or provide data, such as capacitance data 142 using any solution. For example, the computer system 102 can generate and/or be used to capacitance data 142, retrieve capacitance data 142, from one or more data stores, receive capacitance data 142, from another system, send capacitance data 142 to another system, etc.

While shown and described herein as a method and system for modeling the fringe capacitance of components in an integrated circuit prior to the layout design phase, it is understood that aspects of the invention further provide various alternative embodiments. For example, in one embodiment, the invention provides a computer program fixed in at least one computer-readable medium, which when executed, enables a computer system to model the fringe capacitance of components in an integrated circuit prior to the layout design phase. To this extent, the computer-readable medium includes program code, such as the fringe capacitance modeling system 130 (FIG. 15), which implements some or all of the processes and/or embodiments described herein. It is understood that the term "computer-readable medium" comprises one or more of any type of tangible medium of expression, now known or later developed, from which a copy of the program code can be perceived, reproduced, or otherwise communicated by a computing device. For example, the computer-readable medium can comprise: one or more portable storage articles of manufacture; one or more memory/storage components of a computing device; paper; etc.

In another embodiment, the invention provides a method of providing a copy of program code, such as the fringe capacitance modeling system 130 (FIG. 15), which implements some or all of a process described herein. In this case, a computer system can process a copy of program code that implements some or all of a process described herein to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a system for correcting a mask deviation. In this case, a computer system, such as the computer system 102 (FIG. 15), can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; etc.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A computer-implemented method of generating a library object for an integrated circuit design, the method performed using at least one computing device, the method comprising:
    analyzing a pair of integrated circuit design objects for fringe capacitance effects between the pair of integrated circuit design objects using the at least one computing device, the analyzing including:
        determining a type of fringe capacitance scenario between the pair of integrated circuit objects, the type of fringe capacitance scenario selected from the group consisting of:
            a fringe capacitance between a signal metal line and a wide metal line or ground plane in the integrated circuit design,
            a fringe capacitance between a first signal line and a second signal line in the integrated circuit design, and
            a fringe capacitance between an edge of a first line on a first level of the integrated circuit design and a second line on a second level of the integrated circuit design; and
        building a model of the fringe capacitance effect based upon the determined type of fringe capacitance effect; and
    generating the library object accounting for the fringe capacitance effects prior to completion of a layout design for the integrated circuit design using the at least one computing device.

2. The computer-implemented method of claim 1, wherein the pair of integrated circuit design objects represent adjacent lines.

3. The computer-implemented method of claim 1, wherein the pair of integrated circuit design objects represent lines within a same level of the integrated circuit design.

4. The computer-implemented method of claim 1, wherein the pair of integrated circuit design objects represent lines within different levels of the integrated circuit design.

5. The computer-implemented method of claim 1, wherein the fringe capacitance effects include a fringe capacitance between an edge of a first one of the pair of objects and a perpendicularly aligned edge of a second one of the pair of objects.

6. The computer-implemented method of claim 1, wherein the pair of integrated circuit design objects represent neighboring signal lines.

7. The computer-implemented method of claim 1, wherein the fringe capacitance effects include a fringe capacitance between an edge of a first one of the pair of objects and a similar facing edge of a second one of the pair of objects.

8. A system comprising:
    at least one computing device configured to generate a library object for an integrated circuit design by performing actions including:
        analyzing a pair of integrated circuit design objects for fringe capacitance effects between the pair of integrated circuit design objects, the analyzing including:

determining a type of fringe capacitance scenario between the pair of integrated circuit objects, the type of fringe capacitance scenario selected from the group consisting of:
  a fringe capacitance between a signal metal line and a wide metal line or ground plane in the integrated circuit design,
  a fringe capacitance between a first signal line and a second signal line in the integrated circuit design, and
  a fringe capacitance between an edge of a first line on a first level of the integrated circuit design and a second line on a second level of the integrated circuit design; and
building a model of the fringe capacitance effect based upon the determined type of fringe capacitance effect; and
generating the library object accounting for the fringe capacitance effects prior to completion of a layout design for the integrated circuit design.

9. The system of claim 8, wherein the pair of integrated circuit design objects represent adjacent lines.

10. The system of claim 8, wherein the pair of integrated circuit design objects represent lines within a same level of the integrated circuit design.

11. The system of claim 8, wherein the pair of integrated circuit design objects represent lines within different levels of the integrated circuit design.

12. The system of claim 8, wherein the fringe capacitance effects include a fringe capacitance between an edge of a first one of the pair of objects and a perpendicularly aligned edge of a second one of the pair of objects.

13. The system of claim 8, wherein the pair of integrated circuit design objects represent neighboring signal lines.

14. The system of claim 8, wherein the fringe capacitance effects include a fringe capacitance between an edge of a first one of the pair of objects and a facing edge of a second one of the pair of objects.

15. A computer program product comprising program code embodied in at least one non-transitory computer-readable medium, which when executed, enables a computer system to generate a library object for an integrated circuit design by performing actions comprising:
  analyzing a pair of integrated circuit design objects for fringe capacitance effects between the pair of integrated circuit design objects, the analyzing including:
    determining a type of fringe capacitance scenario between the pair of integrated circuit objects, the type of fringe capacitance scenario selected from the group consisting of:
      a fringe capacitance between a signal metal line and a wide metal line or ground plane in the integrated circuit design,
      a fringe capacitance between a first signal line and a second signal line in the integrated circuit design, and
      a fringe capacitance between an edge of a first line on a first level of the integrated circuit design and a second line on a second level of the integrated circuit design; and
  building a model of the fringe capacitance effect based upon the determined type of fringe capacitance effect; and
  generating the library object accounting for the fringe capacitance effects prior to completion of a layout design for the integrated circuit design.

16. The computer program of claim 15, wherein the pair of integrated circuit design objects represent lines within a same level of the integrated circuit design.

17. The computer program of claim 15, wherein the pair of integrated circuit design objects represent lines within different levels of the integrated circuit design.

18. The computer program product of claim 15, wherein in the case that the determined type of fringe capacitance includes the fringe capacitance between the signal metal line and the wide metal line or ground plane in the integrated circuit design, the building of the model includes determining the fringe capacitance ($C_{fs}$) according to the following equation:

$$C_{fs} = 1.8\varepsilon \frac{L}{\pi} \ln\left(\frac{2d + 0.5t_{eff} + \sqrt{t_{eff}^2 + dt_{eff}}}{0.06d}\right),$$

where $t_{eff}$=thickness of the signal metal line, d=distance between the signal metal line and the wide metal line or ground plane, and L=length of the signal metal line.

19. The computer program product of claim 15, wherein in the case that the determined type of fringe capacitance includes the fringe capacitance between the first signal line and the second signal line in the integrated circuit design, the building of the model includes determining the fringe capacitance ($C_{fi}$) according to the following equation:

$$C_{fi} = 2\varepsilon \frac{L}{\pi} \ln\left(\frac{1.25s + W_{eff} + 1.75e - 7}{s}\right),$$

where $W_{eff}$=width of the signal metal line, s=distance between the signal metal line and the second signal metal line, and L=length of the signal metal line.

20. The computer program product of claim 15, wherein in the case that the determined type of fringe capacitance includes the fringe capacitance between the edge of a first line on the first level of the integrated circuit design and the second line on the second level of the integrated circuit design, the building of the model includes determining the fringe capacitance ($C_{fc}$) according to the following equation:

$$C_{fc} = 8\varepsilon \frac{W_{eff}}{\pi} \ln\left[\left(\frac{2h + t_{eff} + \sqrt{t_{eff}^2 + 2ht_{eff}}}{0.1h}\right)\right],$$

where $W_{eff}$=width of the first line, h=vertical distance between the first line and the second line, and $t_{eff}$=thickness of the first line.

* * * * *